United States Patent
Sada et al.

(10) Patent No.: US 6,238,511 B1
(45) Date of Patent: May 29, 2001

(54) METHOD AND APPARATUS FOR PROCESSING SUBSTRATE

(75) Inventors: Tetsuya Sada, Kumamoto-ken; Tetsu Kawasaki, Yamanashi-ken; Mitsuhiro Sakai; Takeshi Tsukamoto, both of Kumamoto-ken, all of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/140,327

(22) Filed: Aug. 26, 1998

(30) Foreign Application Priority Data

Aug. 26, 1997 (JP) ................................. 9-246157

(51) Int. Cl.$^7$ .................................................. B32B 35/00
(52) U.S. Cl. ......................... 156/344; 156/584; 134/172; 216/92
(58) Field of Search ................................. 156/344, 584; 216/92; 118/316, 323; 134/172

(56) References Cited

U.S. PATENT DOCUMENTS

| | | | |
|---|---|---|---|
| 5,688,411 | * 11/1997 | Kutsuzawa et al. | 216/92 |
| 5,695,817 | 12/1997 | Tateyama et al. | 427/240 |
| 5,718,763 | 2/1998 | Tateyama et al. | 118/52 |
| 5,904,164 | * 5/1999 | Wagner et al. | 134/148 |
| 5,952,050 | * 9/1999 | Doan | 427/336 |
| 5,993,552 | * 11/1999 | Tsukumoto et al. | 118/319 |
| 6,062,288 | * 5/2000 | Tateyama | 156/584 |
| 6,079,428 | * 5/2000 | Anai | 134/172 |

FOREIGN PATENT DOCUMENTS

| | | | |
|---|---|---|---|
| 2-157763 | * 6/1990 | (JP) | 156/584 |
| 5-114555 | * 5/1993 | (JP) . | |

* cited by examiner

*Primary Examiner*—Mark A. Osele
(74) *Attorney, Agent, or Firm*—Rader, Fishman & Grauer (57) ABSTRACT

A method of processing a substrate for removing a coating film from a substrate by dissolving the coating film with a solvent, comprising the steps of (a) supplying a solvent independently to each of peripheral portions of an upper surface side and a lower surface side of the substrate, and (b) supplying the solvent to the peripheral portion of the lower surface side of the substrate in an amount lower than the solvent supplied to the peripheral portion of the lower surface side in the step (a) or lower than that supplied to the peripheral portion of the upper surface side in this step (b), or terminating a supply of the solvent.

11 Claims, 8 Drawing Sheets

METHOD AND APPARATUS FOR PROCESSING SUBSTRATE

BACKGROUND OF THE INVENTION

The present invention relates to a substrate processing method and apparatus for use in removing a coating film (a photoresist film and an anti-reflective coating film) formed on a surface of an LCD (liquid crystal display) substrate or on a layer (semiconductor layer, insulating layer, electrode layer) formed on the substrate, from peripheral portion thereof.

In an LCD manufacturing process, a photolithographic technology is usually employed similarly in a manufacturing process for a semiconductor device. In the photolithographic process for LCD, a resist coating film is first formed on a glass substrate. The resultant substrate is pattern-exposed and developed. Thereafter, a semiconductor layer, an insulating layer, and an electrode layer formed on the substrate are selectively etched to obtain an ITO (Indium Tin Oxide) thin film and an electrode pattern.

When a resist solution is applied onto the LCD substrate, it forms a film. Although it is uniform in thickness immediately after the coating, the resist solution rises up at the peripheral portion of the substrate by the influence of the surface tension after rotation is terminated and centrifugal force is no longer applied to the substrate, or with the passage of time. Furthermore, the resist solution spreads and reaches a lower peripheral portion of the substrate G to form an undesirable film. When the non-uniform film (thick in the periphery of the substrate G) is thus formed, the peripheral resist film is not completely removed and left even at the time an integrated circuit pattern is developed. The remaining resist will be removed during the step of transporting the substrate G, leading into particles.

Then, after the resist solution is applied onto the substrate G, the substrate G is transported to a peripheral resist removing mechanism to remove the resist coating film from the peripheral portion of the substrate G. Such a resist removing mechanism is disclosed in U.S. Pat. Nos. 5,718,763 and 5,695,817.

In the meantime, to dissolve the resist solution, a solvent such as n-butyl acetate (NBA) or methylethyl ketone (MEK) has been conventionally used. However, a large amount of the solvent leaks out into the working atmosphere in a factory for producing the LCD substrate in quantity. Under the circumstances, a so-called "safe solvent" having little negative effect on a human body, has been increasingly used. As an example of the safe solvent, an organic solvent such as OK73 thinner (manufactured by TOKYO OHKA KOGYO CO., LTD) may be used. OK73 thinner contains propylene glycol monomethyl ether (PGME) and propylene glycol monomethyl ether acetate (PGMEA) in a ratio of 3:7. As another example, 2-heptanon may be mentioned. 2-heptanon is a less-volatile solvent having a high boiling point (e.g., 140° C. or more).

Of these safe solvents, however, OK 73 thinner has a poorer solubility of the resist film than conventionally employed solvents. It is therefore difficult to remove the resist coating film completely from the peripheral portion of the substrate by a method employing the conventionally-employed solvent.

BRIEF SUMMARY OF THE INVENTION

An object of the present invention is to provide a substrate processing method and apparatus capable of removing a coating film from a peripheral portion of the substrate swiftly and securely even if a solvent (safe solvent) poor in solubility is used.

According to the present invention, there is provided a method of processing a substrate for removing a coating film from the substrate by dissolving the coating film with a solvent, comprising the steps of:

(a) supplying a solvent independently to each of peripheral portions of an upper surface side and a lower surface side of the substrate; and (b) supplying the solvent to the peripheral portion of the lower surface side of the substrate in an amount lower than the solvent supplied to the peripheral portion of the lower surface side in the step (a) or lower than that supplied to the peripheral portion of the upper surface side in this step (b); or terminating a supply of the solvent.

In the step (b), it is desirable that the first and second nozzles be moved along the peripheral portion of the substrate while supplying the solvent, and that the scanning speeds of the first and second nozzles be reduced as the first and second nozzles approach a corner portion of the substrate.

It is also desirable, in the step (b), that the first and second nozzles be moved along the peripheral portion of the substrate while supplying the solvent, and that the solvent supply amounts from the first and second nozzles be increased as the first and second nozzles approach a corner portion of the substrate.

Furthermore, it is desirable that a total amount of the solvent supplied from the first and second nozzles in the step (b) be smaller than a total amount of the solvent supplied form the first and second nozzles in the step (a).

It is desirable, in the step (a), that the solvent be supplied from the first and second nozzles at a rate of at least 30 cc/minute, and that the flow route thereof on the substrate along a side of the substrate be 50 mm or more in length.

It is preferred to use an organic solvent containing propylene glycol monomethyl ether (PGME) and propylene glycol monomethyl ether acetate (PGMEA) in a ratio of 3:7, as the solvent. An ether-based organic solvent such as 2-heptanon may be used.

An apparatus for processing a substrate according to the present invention comprises a table for adsorbing and holding a substrate with a coating surface upward;

a solvent supply mechanism for supplying a solvent, independently to each of peripheral portions of the upper surface side and a lower surface side of the substrate mounted on the table; and a control mechanism for controlling the solvent supply mechanism to selectively supply the solvent either to both upper surface side and lower surface side or only to the upper surface side.

A method of processing a substrate according to the present invention comprises the steps of:

(A) supplying a solvent from a solvent supply mechanism while sucking the solvent by a suction-discharge mechanism to relatively move the solvent supply mechanism, the suction-discharge mechanism, and the substrate, thereby permitting the solvent supply mechanism and the suction-discharge mechanism to come closer to or go away from a peripheral portion of the substrate;

(B) discharging the solvent and a dissolved matter by the suction-discharging mechanism while supplying the solvent to the peripheral portion of the substrate by the solvent supply mechanism.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Now, various preferred embodiments of the present invention will be explained with reference to the accompanying drawings.

Figure 1:
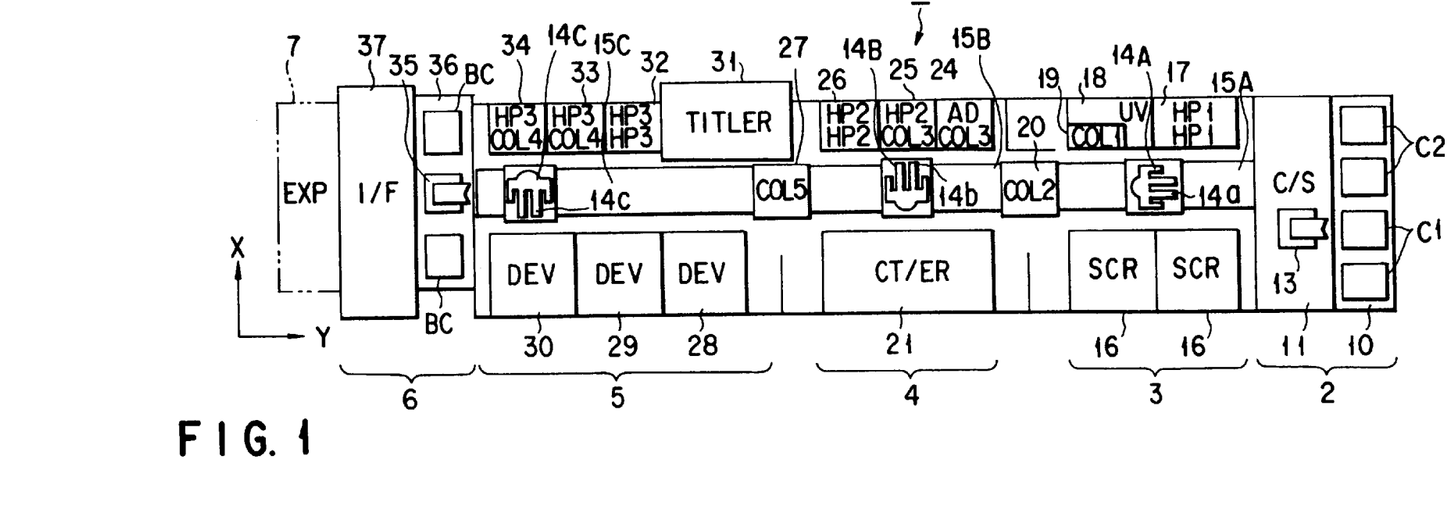
FIG. 1 is a schematic plan layout showing an LCD substrate process system.
Figure 2:
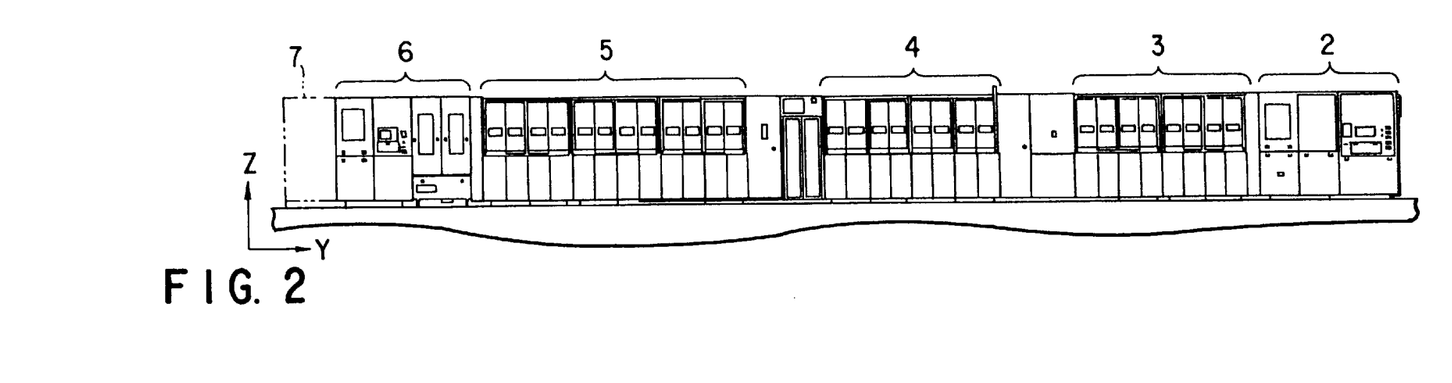
FIG. 2 is a front external view of the LCD substrate process system.

As shown in FIGS. 1 and 2, the coating/developing process system 1 has a load/unload section 2, a first process section 3, a second process section 4, a third process section 5, and an interface section 6. The process system 1 has various process mechanisms for coating a photoresist solution onto an LCD substrate G and developing the substrate G. The process system 1 is connected to a light-exposing apparatus via the interface section 6.

The load/unload section 2 has a cassette table 10 extending in an X-direction and a transporting portion 11. In the cassette table 10, at most four cassettes C1, C2, are arranged side by side. Unprocessed LCD substrates G are stored in two cassettes C1, whereas processed LCD substrates G are stored in other two cassettes C2. Each of the cassettes C1, C2, stores, for example, 25 LCD substrates G, at maximum.

A first sub-arm mechanism 13 is provided in the transporting portion 11 of the load/unload section 2. The first sub-arm mechanism 13 has a holder for loading/unloading the substrate G into/from the cassettes C1, C2, a back-and-force moving mechanism for moving the holder back and forth, an X-axis moving mechanism for moving the holder in the X-axis direction, a Z-axis moving mechanism for moving the holder in the Z-axis, and a θ rotation mechanism for rotating the holder about the Z-axis, in a swinging manner.

The first process section 3 has a central transporting passage 15A extending in a Y-axis direction, a first main arm mechanism 14A movable along the transporting passage 15A, and a plurality of process units 16, 17, 18, 19. Two wet-washing units 16 are arranged at one side of the transporting passage 15A. The unit 16 has a brush scrubber SCR for scrub-washing a surface of the substrate by a rotatable brush while pouring a washing processing solution onto the substrate G. A heating unit 17, a dry-washing unit 18 and a cooling unit 19 are arranged at the other side of the transporting passage 15A. The heating unit 17 has upper and lower-stage hot plates HP1 for heating the substrate G. The dry-washing unit 18 has an ultraviolet washing apparatus UV for washing the surface of the substrate G by ultraviolet irradiation. The cooling unit 19 has a cooling plate COL1 for cooling the substrate G. The first main arm mechanism 14A has a holder 14a for holding the substrate G, a back-and-forth moving mechanism for moving the holder 14a back and forth, a Z-axis moving mechanism for moving the holder 14a in the Z-axis direction, and a θ rotation mechanism for rotating the holder 14a about the Z-axis in a swinging manner.

The second process section 4 has a central transporting passage 15B extending in the Y-axis direction, a second main arm mechanism. 14B movable along the transporting passage 15B, and a plurality of process units 21, 24, 25, 26. A resist coating/peripheral resist removing unit 21 are arranged at one side of the transporting passage 15B. The unit 21 has a resist coating device CT for coating the resist solution while spin-rotating the substrate G, and a peripheral resist removing device ER for removing the resist coating film from the peripheral portion of the substrate. An adhesion/cooling unit 24, a heating/cooling unit 25, and a heating/heating unit 26 are arranged at the other side of the transporting passage 15B. The adhesion/cooling unit 24 has an adhesion device AD and a cooling plate COL 3 for cooling the substrate G. The adhesion devise AD is responsible for imparting a hydrophobic property to the surface of the substrate G by applying HMDS vapor thereto. The heating/cooling unit 25 has a hot plate HP2 for heating the substrate G and a cooling plate COL 3 for cooling the substrate G. The heating/heating unit 26 has upper and lower-stage hot plates HP2 for heating the substrate G.

The third process section 5 has a central transporting passage 15C extending in the Y-axis direction, a third main arm mechanism 14C movable along the transporting passage 15C, and a plurality of process units 28, 29, 30, 31, 32, 33, 34. Three developing units 28, 29, 30 are arranged at one side of the transporting passage 15C. Each of units 28, 29, 30 has a developing device DEV for developing the resist coating film while pouring a developing solution onto the substrate G. A titler 31, a heating/heating unit 32, and a heating/cooling units 33, 34 are arranged at the other side of the transporting passage 15C. Note that the second and third main arm mechanisms 14B and 14C are substantially the same as the first main arm mechanism 14A. A cooling unit 20 is interposed between the first process section 3 and the second process section 4. In addition, a cooling unit 27 is interposed between the second process section 4 and the third process section 5. These cooling units 20 and 27 are also used as a standby area for temporality holding the substrate G during standby for next processing.

The interface 6 is interposed between the third process section and the light-exposure apparatus 7. The interface 6 has a transport/standby portion 36 and a transfer portion 37. The transport/stand-by portion 36 has a second sub-arm mechanism 35 and two buffer cassettes BC. The second sub-arm mechanism 35 is substantially the same as the first sub-arm mechanism 13. Each of the buffer cassettes BC stores non-processed substrates G waiting for processing and serves as a temporary standby area for the substrate G. A transfer table (not shown) is provided in the transfer portion 37. The substrate G is transferred between a transfer mechanism (not shown) of the light-exposure apparatus 7 and the second sub-arm mechanism 35 via the transfer table.

Figure 3:
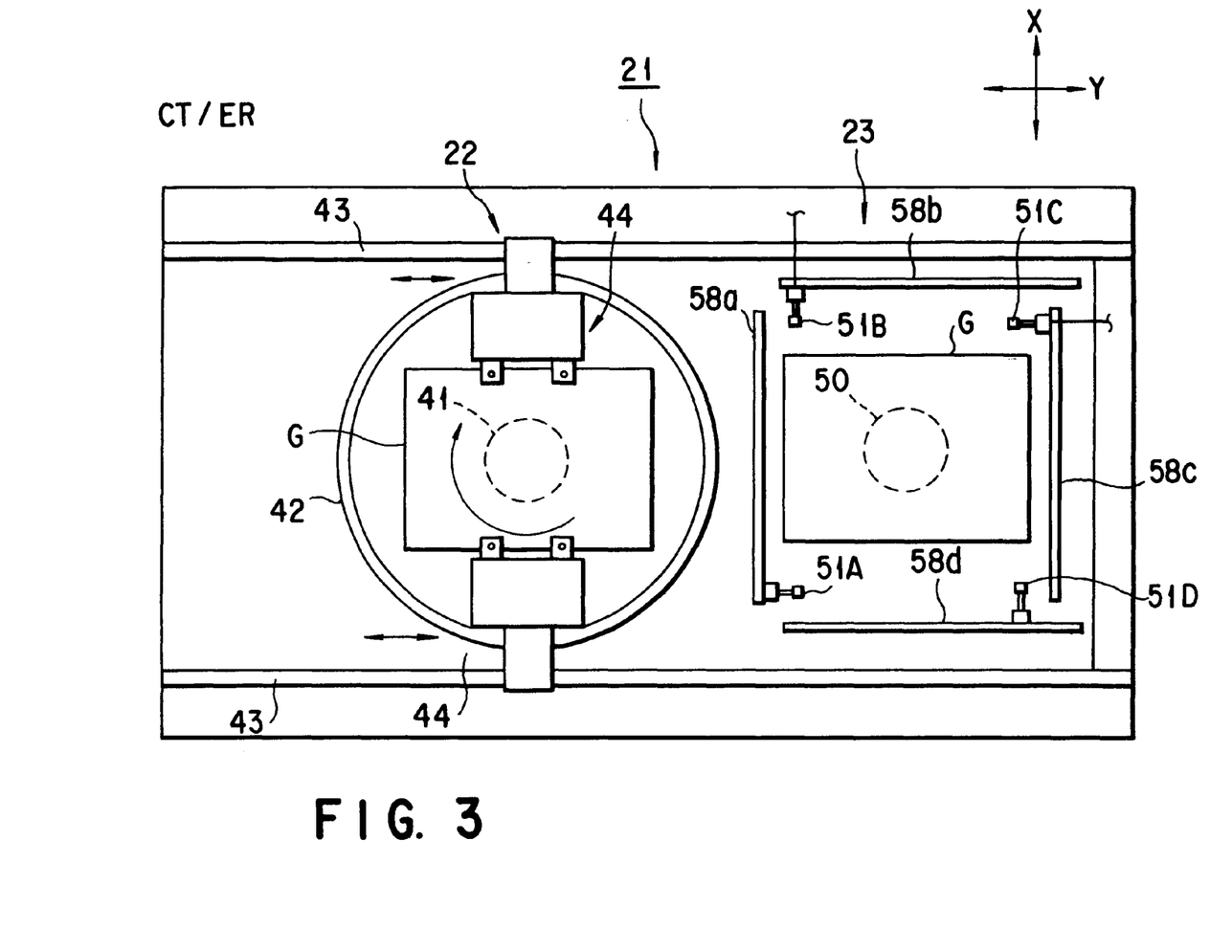
FIG. 3 is a schematic plan view showing a resist coating/peripheral resist removing unit (CT/ER)

As shown in FIG. 3, the unit 21 has a resist coating portion 22 and a peripheral resist removing portion 23. Two open/close inlets (not shown) are formed on the front wall of the unit 21. The substrate G is loaded into the resist coating portion 22 through one of the two inlets by the first main arm mechanism 14B. The substrate G is unloaded from the peripheral resist removing portion 23 through the other open/close inlet. The resist coating portion 22 has a spin chuck 41 and a cup 42. The peripheral resist removing portion 23 has a spin chuck 50 and a cup CP (see FIG. 9).

A pair of guide rails 43 are laid from the peripheral resist removing portion 23 to the resist coating portion 22. A transporting mechanism 44 is provided movably along the guide rails 43 in the Y-axis direction. The transporting mechanism 44 has a pair of chuck members for adsorbing and holding the substrate G. The substrate G is transported by the transporting mechanism 44 from the resist coating portion 22 to the peripheral resist removing portion 23.

Figure 4:
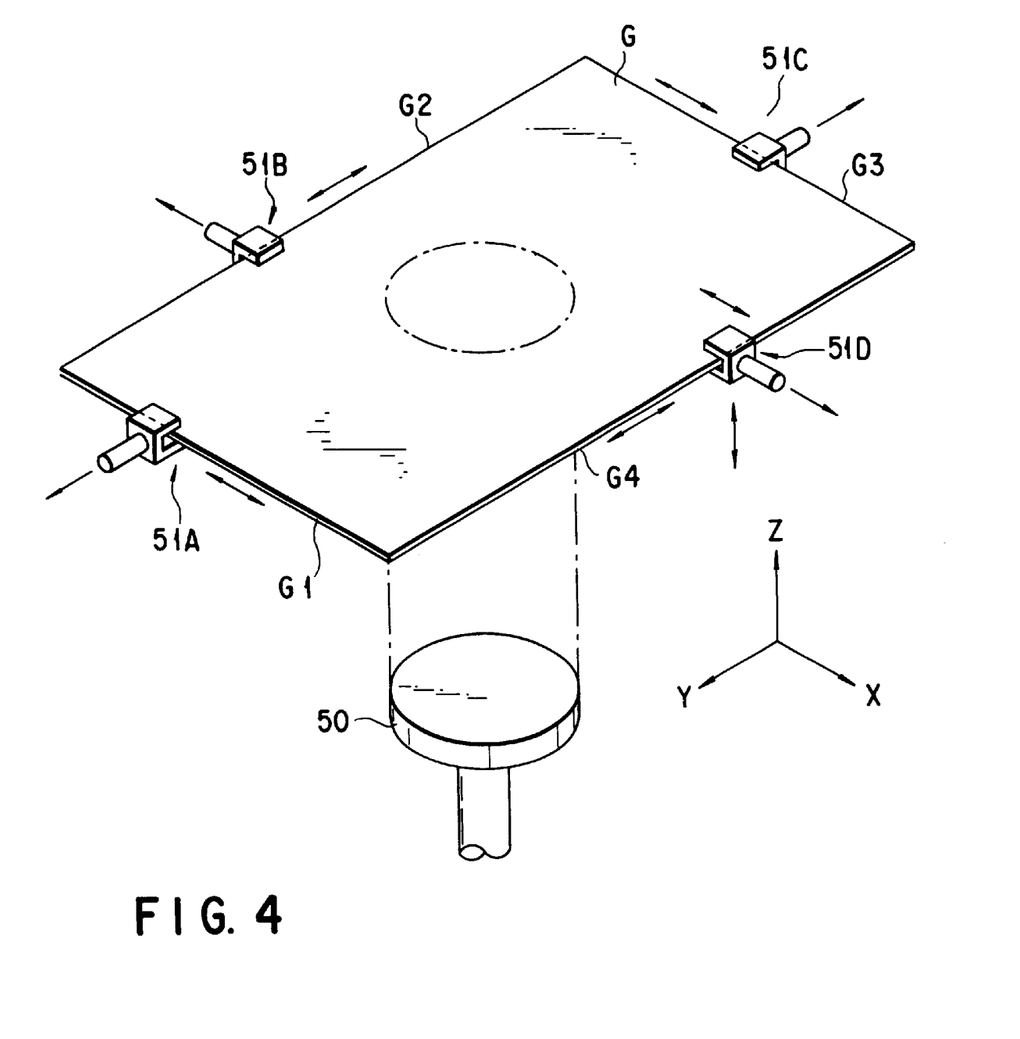
FIG. 4 is a perspective view of an edge remover and an LCD substrate of the peripheral edge resist removing section.

As shown in FIG. 4, four edge removers 51A, 51B, 51C, 51D are separately provided movably in the peripheral resist removing portion 23. The first edge remover 51A moves along a short side G1 of the substrate. The second edge remover 51B moves along a long side G2 of the substrate. The third edge remover 51C moves along a short side G3 of the substrate. The fourth edge remover 51D moves along a long side G4 of the substrate.

Figure 5:
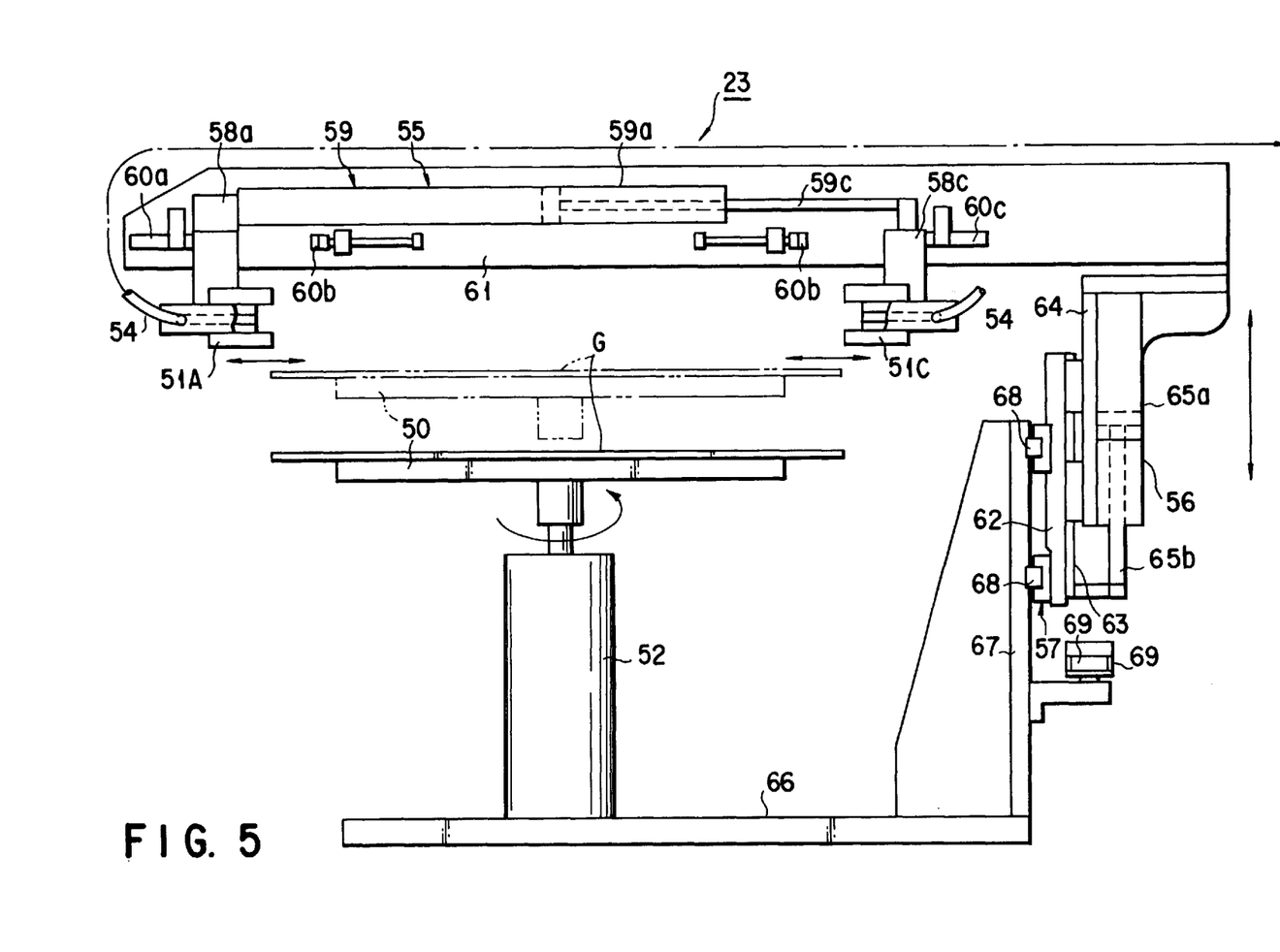
FIG. 5 is a perspective sectional view of a peripheral resist removing section, partially broken away, showing an inner driving system of the substrate process apparatus of the present invention.

As shown in FIG. 5, the spin chuck 50 is rotatably and liftably supported by a driving section 52. The driving section 52 is fixed on a base 66. The driving section 52 has a vacuum exhaust mechanism (not shown) for holding the substrate G by adsorption on an upper surface of the spin chuck 50, a motor (not shown) for rotating the spin chuck 50, and a cylinder (not shown) for moving the spin chuck 50 up and down, therein. The spin chuck 50 is moved up and down by the cylinder. The spin chuck 50 can be moved to three positions: a first level (home position), a second level at which the substrate G is transferred, and a third level at which removal of the resist coating film is performed.

The first and third edge removers 51A, 51C are movably supported by three moving mechanisms 55, 56, 57. The first moving mechanism 55 has an air cylinder mechanism 59, an outer stopper 60a, and an inner stopper 60b. When a rod 59c is allowed to protrude or withdraw from the cylinder 59a, the first and third edge removers 51A, 51C advance toward or retreat from each other to set the position thereof. The outer and inner stoppers 60a, 60b are fitted onto a member 61 and limits the moving stroke of the first and third edge removers 51A, 51C. The second moving mechanism 56 has a liner guide 63, a slider 64, a cylinder 65a, and a rod 65b. When the rod 65b is allowed to protrude or withdraw from the cylinder 65a, the first and third edge removers 51A, 51C move up and down. The third moving mechanism 57 has liner guides 67, 58a, 58c, sliders 68, 60a, 60c, a ball screw mechanism (not shown), and a stepping motor (not shown). When the ball screw is rotated, the sliders 68, 60a, 60c move along the linear guides 67, 58a, 58c, respectively, thereby moving the first and third edge removers 51A, 51C, respectively in a horizontal direction. Driving sources of the first, second, third moving mechanisms 55, 56, 57 are respectively controlled by a controller 80. The second and fourth edge removers 51B, 51D have substantially the same structure as those of the first and third edge removers 51A, 51C.

Figure 6:
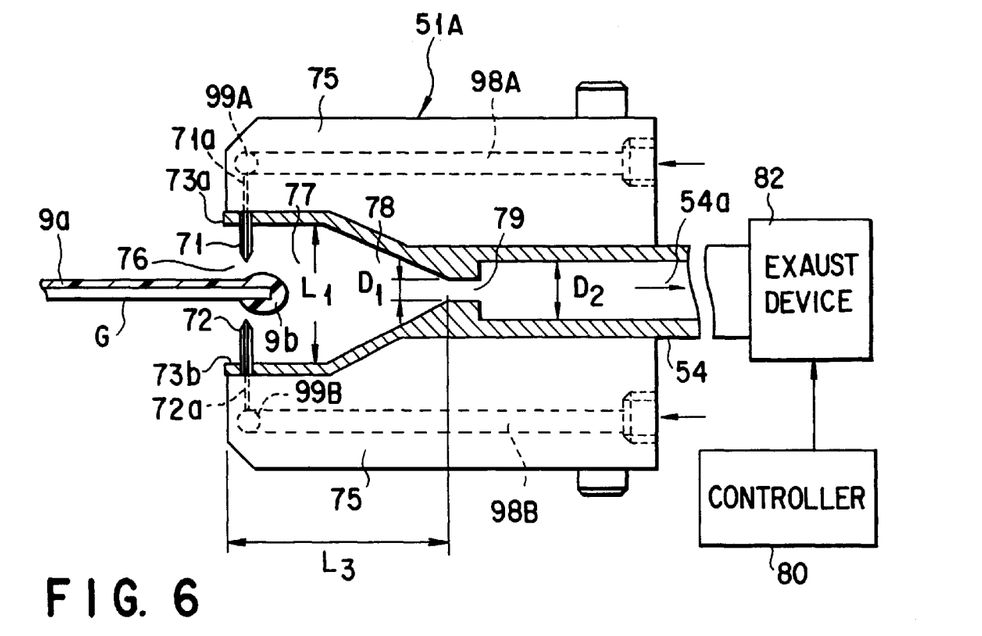
FIG. 6 is a sectional view of a gist portion of the substrate process apparatus according an embodiment of the present invention, partially broken away, accompanying a block diagram of peripheral elements.
Figure 7:
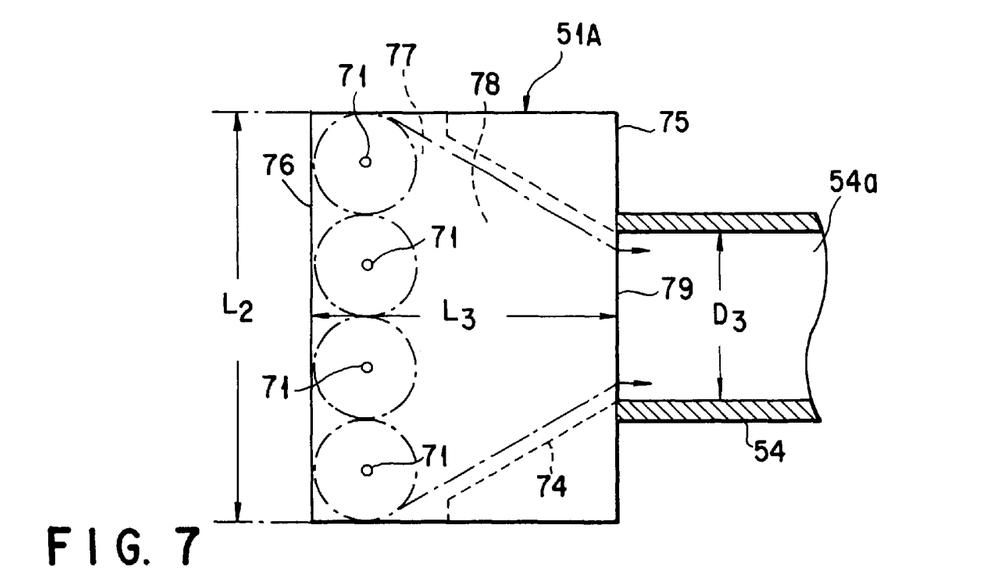
FIG. 7 is a plan view of a gist portion of the substrate process apparatus according to an embodiment of the present invention, partially broken away.
Figure 8:
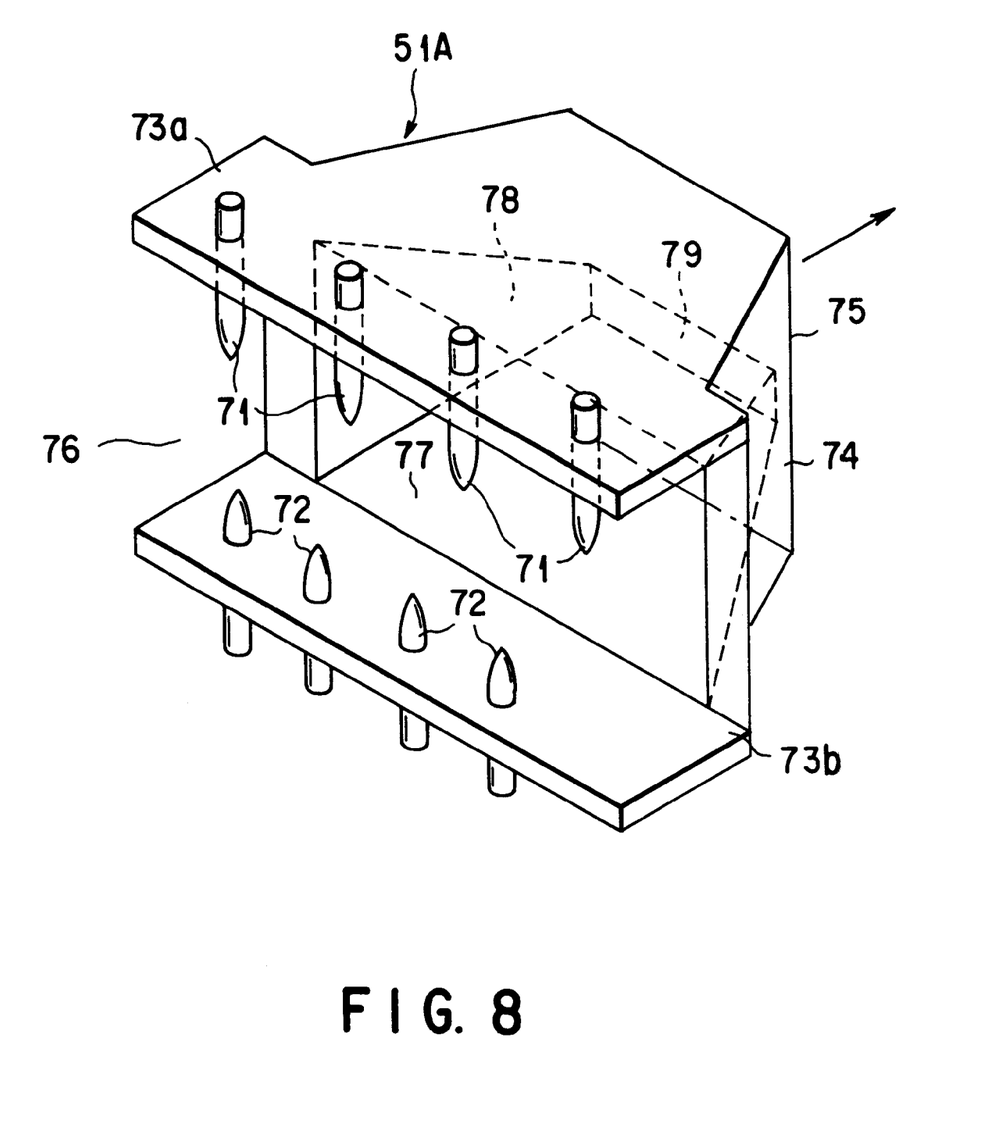
FIG. 8 is an exploded perspective view of the substrate process apparatus according to an embodiment of the present invention.

Referring now to FIGS. 6 to 8, the first edge remover 51A will be explained as a representative example of the edge remover.

The edge remover 51A has upper and lower needle nozzles 71, 72, upper and lower walls 73a, 73b, a side wall 74, a block 75, and a vacuum exhaust pipe 54. The block 75 is connected to the slider of the third moving mechanism 57 and supported by the third moving mechanism 57. A solvent supply route 98A is inserted into an upper part of the block 75. The solvent supply route 98A communicates with four discharge passages 71a by way of a header 99A. Each of the discharge passages 71a communicates with a discharge port of the upper needle nozzle 71. On the other hand, a solvent supply route 98B is formed in a lower part of the block 75. The solvent supply route 98B communicates with four discharge passages 72a by way of a header 99B. Each of the discharge passages 72a communicates with a discharge port of the lower needle nozzle 72.

The upper needle nozzle 71 is attached to an upper wall 73a of the block 75. The lower needle nozzle 72 is attached to a lower wall 73b of the block 75. When the peripheral portion of the substrate G is positioned within a distal opening 76 (solvent supply space) of the block 75, as shown in FIG. 6, the supply port of the upper needle nozzle 71 faces the upper surface of the substrate G, whereas the supply port of the lower needle nozzle 72 faces a lower surface of the substrate G. Note that the supply ports of the upper and lower needle nozzles 72 are positioned at a distance of 3–4 mm from the edge of the substrate G. The inner diameters of the discharge ports of the upper and lower needle nozzles 71, 72 are about 0.26 mm. The distance between the discharge port of the upper needle nozzle 71 and the surface of the substrate G is set at about 1.0 mm. The distance between the discharge port of the lower needle nozzle 72 and the surface of the substrate G is set at about 1.0 mm.

As shown in FIG. 8, four upper needle nozzles 71 and four lower needle nozzles 72 are formed. The supply ports of the upper nozzles 71 are arranged staggeringly so as not to face in line.

As shown in FIG. 6, a suction-discharge passage consisting of passages 77, 78, 79, 54a is formed so as to pass through the middle portion. A dissolved resist and a surplus solvent are sucked and discharged through the suction-discharge passage. A solvent supply space (distal end opening of the block) 76 successively communicates with a large-diameter passage 77, a narrow passage 78, an orifice passage 79, a regular passage 54a, and a vacuum exhaust device 82. In this case, a height (diameter) L1 of the large-diameter passage 77 preferably falls within the range of 50 to 100 mm, and a depth (length) L3 within the range of 25 to 200 mm. A longitudinal diameter D1 of the orifice passage 79 preferably falls within the range of 6 to 11 mm and a lateral diameter D3 within the range of 11 to 60 mm. Furthermore, a diameter D2 of the regular passage 54a is desirably set at 12 mm or more. A height L1 of the solvent supply space (distal end opening of the block) 76 desirably falls within the range of 50 to 100 mm, and a width L2 within the range of 25 to 100 mm.

As shown in FIG. 7, the side wall 74 of the narrow passage 78 is formed between a position at a distance of about 4 mm inward from the distal-end opening 76 of the block, and the orifice passage 79.

Figure 9:
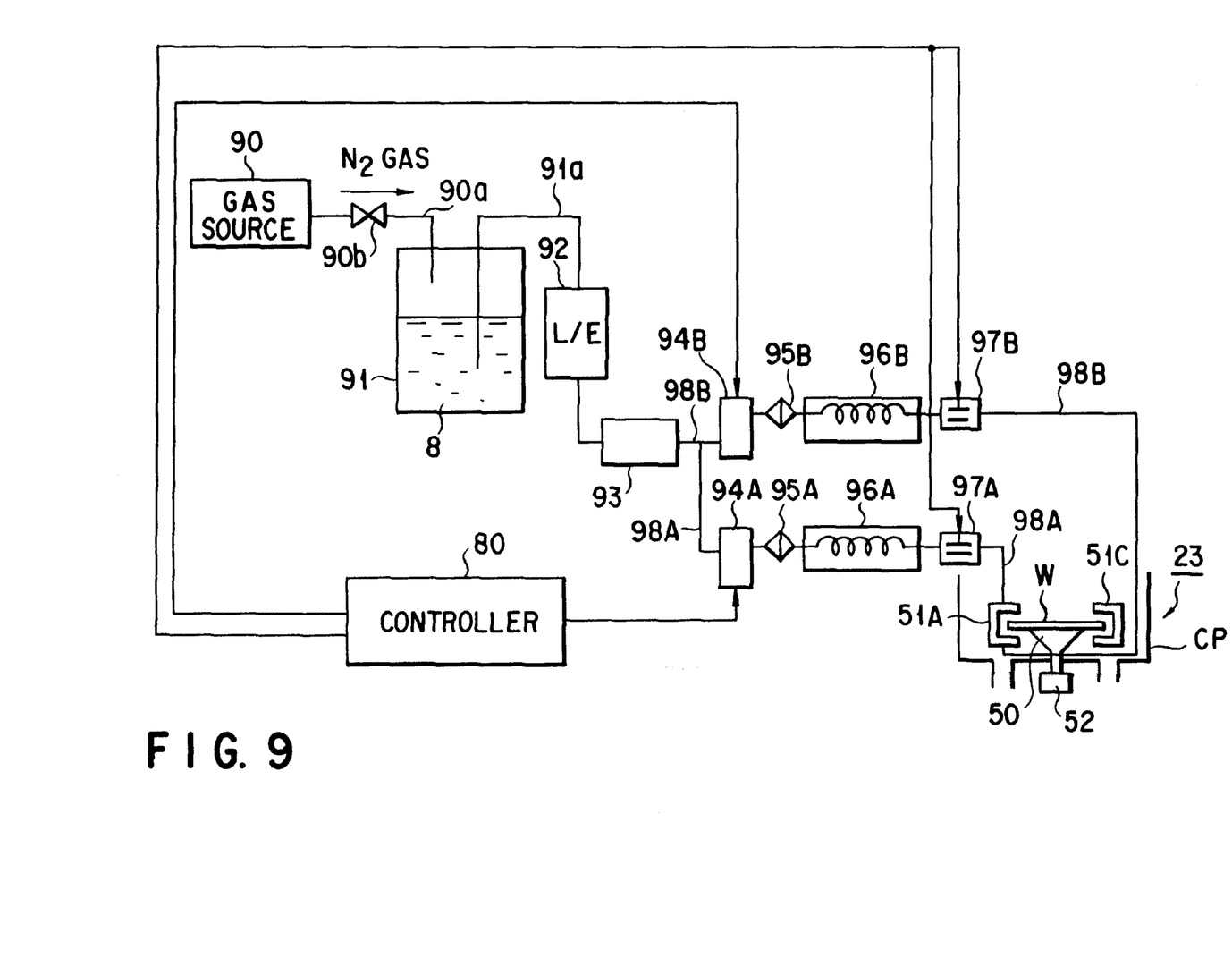
FIG. 9 is a block diagram showing a solvent supply route.

Now, referring to FIGS. 9 and 6, the solvent supply route of the first edge remover 51A will be explained. The solvent supply routes of the second, third, and fourth edge removers 51B, 51C, 51D are substantially the same as that of the first edge remover 51A. The drawings and explanations thereof will be omitted herein.

A gas supply inlet 90a and a solvent supply pipe 91a are inserted into a tank 91 serving a solvent supply source. When a valve 90b is opened, pressurized $N_2$ gas is introduced into the tank 91 from a gas supply source 90 by way of the pipe 90a. Then, the solvent 8 is sent out from the tank 91 toward the pipe 91a with the help of the pressure of $N_2$ gas. The solvent supply pipe 91a is equipped with a liquid level indicator 92 and an air-bubble removing device 93. The liquid-level indicator 92 is responsible for determining a liquid level of the solvent 8 contained in the tank 91. The air bubble removing device 93 is responsible for removing air bubbles from the solvent sent out from the tank 91.

The solvent supply pipe 91a is branched into two lines 98A, 98B. As shown in FIG. 6, the branched line 98A communicates with the upper nozzle 71 of the first edge remover 51A, whereas the branched line 98B communicates with the lower nozzle 72 of the first edge remover 51A. The branched lines 98A, 98B are equipped with flow-rate control valves 94A, 94B, filters 95A, 95B, temperature controlling mechanisms 96a, 96B, air operation valves 97A, 97B, respectively in the order mentioned. Note that the flow-rate control valves 94A, 94B and air operation valves 97A, 97B are independently controlled by the controller 80.

Figure 10:
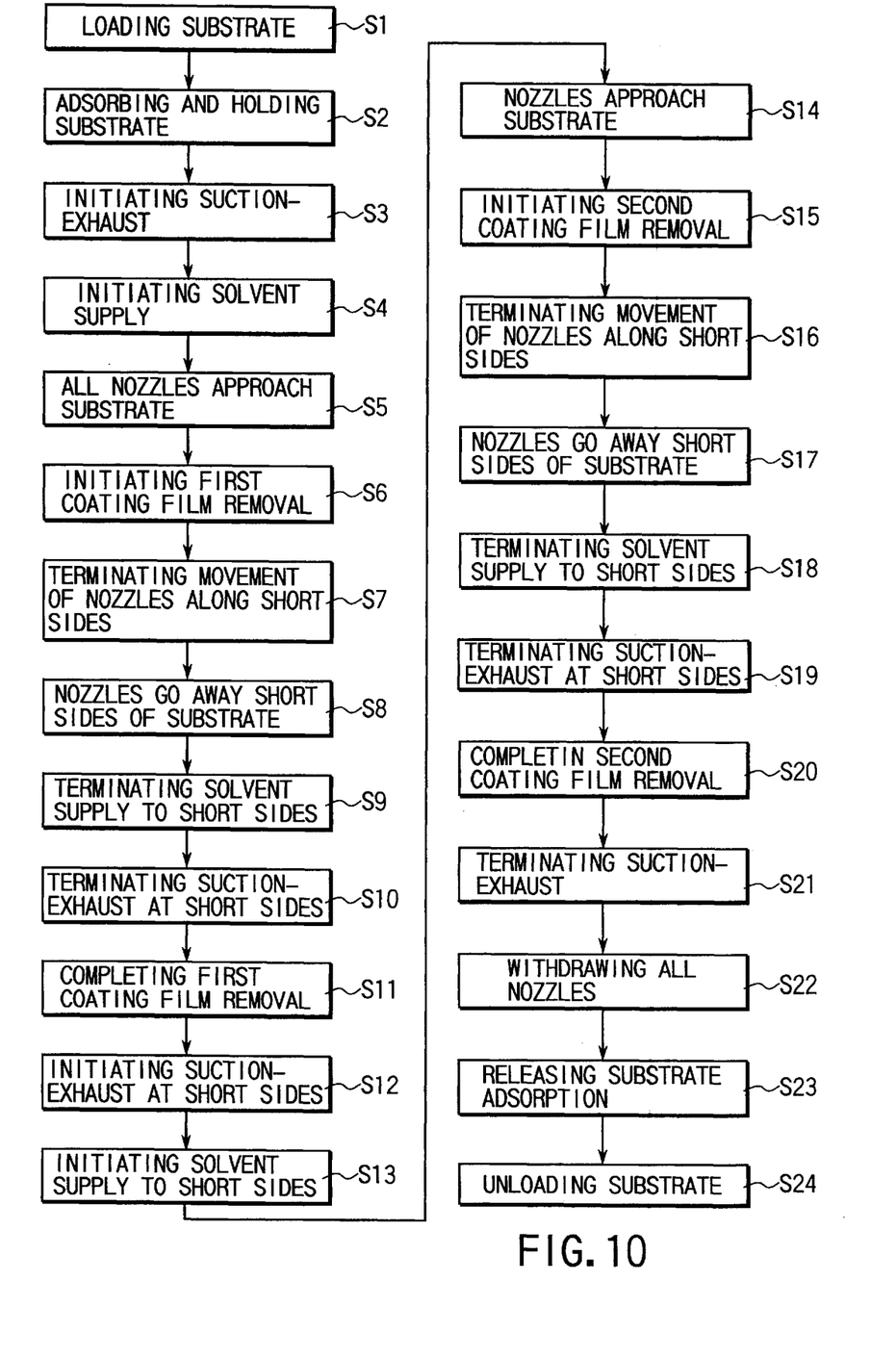
FIG. 10 is a flowchart showing a method of processing a substrate according an embodiment of the present invention.

Referring now to FIG. 10, we will explain the case where the substrate G is subjected to the resist removing process employing the aforementioned apparatus.

A single substrate G is taken out from the cassette C1 by the first sub-arm mechanism 13. The substrate G is transferred from the first sub-arm mechanism 13 to the first main arm mechanism 14A. Then, the first main arm mechanism 14A transports the substrate G to the washing unit 18. In the washing unit 18, a surface of the substrate G is washed with UV ozone by irradiating ultraviolet rays to the substrate in the presence of ozone. Subsequently, the substrate G is transported by the first main arm mechanism 14A to the washing unit 16, in which the surface of the substrate G is washed by a rotatable brush in a scrubbing manner while pouring a washing solution onto the substrate G. Thereafter, the substrate G is rinsed with pure water and dried.

The first main arm mechanism 14A transfers the substrate G to the second main arm mechanism 14B via the unit 20. The second main arm mechanism 14B transports the substrate G to the adhesion unit 24. In the adhesion unit 24, HMDS vapor is applied to the substrate G while heating. The surface of the substrate G is rendered hydrophobic by this treatment. The substrate G is cooled to a desired temperature (e.g. 23° C.) in a cooling section COL 3. The substrate G is loaded into the unit 21. First, a resist solution is applied onto the substrate G in the resist coating portion 22. The film thickness of the resist coating film 9a is, for example, 1.6 $\mu$m (1600 nm) in average. The film thickness of the peripheral portion of the coating film 9b is slightly thicker than the average thickness.

Then, the substrate G is transported from the resist coating portion 22 to the peripheral resist removing portion 23 by the transporting mechanism 44. The substrate G is loaded into the peripheral resist removing portion 23 by the transporting mechanism 44 (Step S1). Then, the spin chuck 50 is ascended and the substrate G is transferred from the transporting mechanism 44 onto the spin chuck 50. The substrate G is adsorbed onto the spin chuck (Step S2). Thereafter, the transporting mechanism 44 is withdrawn from the peripheral resist removing portion and the spin chuck 50 is descended.

The edge removers 51A, 51B, 51C, 51D are allowed to move from home positions to operation positions; at the same time, evacuation of the edge removers 51A, 51B, 51C, 51D is initiated by the vacuum exhaust device 82 (Step S3). Supply of the solvent 8 is started from each of the upper and lower nozzles 71, 72 at a flow rate of 30 cc/minute (Step S4). All of the edge removers 51a, 51B, 51C, 51D are moved closer to the periphery of the substrate G while supplying the solvent 8, thereby setting each of the nozzles 71, 72 at the peripheral portion of the substrate, as shown in FIG. 6 (Step S5). Subsequently, the edge removers 51A, 51B, 51C, 51D are respectively moved in a scanning manner along sides G1, G2, G3, G4 of the substrate. In this way, a first coating film removing operation is initiated (Step S6). The coating film 9b is dissolved and removed from the peripheral portions of short sides G1, G3 by the first and third edge removers 51A, 51C. At the same time, the coating film 9b is dissolved and removed from the peripheral portion of long sides G2, G4 of the substrate by the second and fourth edge removers 51B, 51D. The dissolved resist and a surplus solvent 8 are suctioned through the passage 77, 78, 79, 54a and exhausted by the exhaust device 82.

When the first and third edge removers 51A, 51C reach the ends (corner portion) of short sides G1, G3 of the substrate, respectively, the scan movement thereof is terminated and the solvent supply operation is stopped (Step S7). It is desirable that the scanning operation be slowed or that the solvent supply amount be increased as the first and third edge removers 51A, 51C approach the ends of the short sides G1, G3. If so, the coating film 9b, which has been applied thick at the corner portion of the substrate G, can be easily removed.

Subsequently, the first and third edge removers 51A, 51C are moved backward while supplying the solvent 8, thereby permitting the nozzles 71, 72 to go away from the short sides G1, G3 of the substrate G (Step S8). Thereafter, the supply of the solvent 8 from the nozzles 71, 72 to the short sides G1, G3, is terminated (Step S9). Furthermore, the suction-discharge of the solvent from the short sides G1, G3 is terminated (Step S10).

The second and fourth edge removers 51B, 51D are moved in such a manner that the scan-moving speed thereof is slowed or the solvent supply amount is increased as they approach the ends of the long sides G2, G4 of the substrate. When the edge removers reach the ends of the long sides G2, G4, a first coating-film removing operation is completed (Step 11).

The suction-discharge from the short sides G1, G3 is initiated again (Step S12). Furthermore, the supply of the solvent 8 to the short sides G1, G3 is initiated (Step S13). Each of the first and third edge removers 51A, 51C is moved closer to the peripheral portion of the substrate G (Step S14) while supplying the solvent 8 from the nozzles 71, 72. Each of the nozzles 71, 72 is allowed to position at the peripheral portion of the substrate G, as shown in FIG. 6.

Then, the third moving mechanism 57 is driven in a reverse direction to move the edge removers 51A, 51B, 51C, 51D along the sides G1, G2, G3, G4, respectively, in a scanning manner. A coating film removing operation of a second time is thus initiated (Step S15). Note that the second and fourth edge removers 51B, 51D are returned backward after they exceed the ends of the long sides G2, G4 of the substrate G, respectively. More specifically, the points of return for the second and fourth edge removers 51B, 51D are located outside the substrate G.

When the first and third edge removers 51A, 51C arrive at the ends (corner portions) of the short sides G1, G3 of the substrate, the scan-movement is terminated (Step S16). Subsequently, the first and third edge removers 51A, 51C are moved backward while supplying the solvent 8, thereby permitting the nozzles 71, 72 to go away from the short sides G1, G3 of the substrate G (Step S17). Thereafter, the supply of the solvent 8 from the nozzles 71, 72 to the short sides G1, G3 is terminated (Step 18). Furthermore the suction-discharge from the short sides G1, G3 is terminated (Step S19).

In the second coating film removing operation, the supply of the solvent 8 from the lower nozzle 72 is stopped or drastically reduced in amount up to, for example, 10 cc/minute. However, the supply amount of the solvent 8 from the upper nozzle 71 is maintained at 30 cc/minute.

The second and fourth edge removers 51B, 51D are moved in such a manner that the scan-moving speed thereof is slowed or the solvent supply amount is increased as they approach the ends of the long sides G2, G4 of the substrate. When the edge removers reach the ends of the long sides G2, G4, the supply operation of the solvent 8 is stopped. In this manner, the second coating-film removing operation is completed (Step S20). Subsequently, all suction-exhaust operations of the edge removers 51A, 51B, 51C, 51D are terminated (Step 21). All of the edge removers 51A, 51B, 51C, 51D are returned from the operation positions to the home positions (Step S22). Thereafter, the spin chuck 50 is ascended to release the adsorption of the substrate G therefrom (Step S23). Subsequently, the substrate G is unloaded from the unit 21 by the second main arm mechanism 14B (Step S24). Processing time required for one cycle operation from the step S1 to S24 is about 34 seconds.

In the aforementioned embodiments, we have explained the edge removers having a movable nozzle in a scanning manner. However, the present invention is not limited to this. The present invention can be applied to the edge remover disclosed in U.S. Ser. No. 08/904,850 (filed Aug. 1, 1997).

Now, we will describe how to attain the present invention.

The present inventors have conducted studies and made efforts with a view toward increasing the removing performance of the resist coating film 9b by the edge remover. As a result, they found the edge remover having the aforementioned structure. The present inventors tried to optimize the flow rate of the solvent on the assumption that the removing performance of resist coating film will be improved if the supply amount of the solvent 8 is increased.

Removal processing of the coating film 9b from the LCD substrate G of 650 mm×550 mm in size is performed by varying the supply amount of the solvent by use of the aforementioned apparatus. The width L2 of the solvent supply space (distal end portion of the block) 76 was set at 30 mm. The inner diameter D2 of the regular passage 54a for suction-discharge was set at 9 mm and the thickness of the resist coating film 9a at about 7 μm. Air was supplied into the vacuum exhaust device 82 at a pressure of 2.5 to 3 kgf/cm² to set a differential pressure ΔP of the suction-discharge passage 54a at −18 to −20 mmHg.

The edge removers 51B, 51D were moved in a scanning manner three times at a speed of 60 mm/second along the long sides G2, G4 of the substrate, thereby removing the resist coating film 9b. After completion of the removal process, the removing performance of the resist coating film 9b was evaluated. To evaluate the coating film removing performance, the surface and edge surfaces of the substrate G were wiped with cloth impregnated with acetone, after completion of the removal process. Evaluation was made on the basis of the resist amount attached to the cloth.

Table 1 shows results of the coating-film removing performance in the case where a flow rate of the solvent supply is changed variously. In the table, a double circle ⊚ indicates the state that the resist coating film 9b is completely removed from the substrate G. A single circle ○ indicates the state that the resist coating film 9b is mostly removed from the substrate G. A triangle Δ indicates the state that the resist coating film 9b remains the substrate G. From the results, it is confirmed that the removing performance is enhanced if the supply amount Q of the solvent 8 increases. It is demonstrated that the resist coating film 9b is mostly removed if the solvent is sprayed three times at a flow rate Q of 50 cc/minute. However, visual observation of the surface of the substrate G revealed that when the supply rate Q of the solvent 8 is large, the solvent 8 and the dissolved resist are not completely sucked and discharged, remaining on the substrate G. Due to this phenomenon, the surface of the substrate G looks wet. The present inventors postulated that the remaining matter prevents the removal of the resist coating film 9b. Then, further studies have been made as to how to suck and discharge the remaining matter.

The present inventors paid attention to the idea that the width of the flow route of the solvent 8 on the substrate may be enlarged by increasing the width L2 of the solvent supply space (distal end opening of the clock) 76 with an increase of the flow rate Q. The resist removing process was performed in the same conditions as in the above except the width L2 and the solvent supply rate Q. After completion of the removal process, whether or not the solvent 8 and the dissolved resist were left on the substrate G, was checked in the same manner.

When the solvent 8 is supplied to the substrate G from the nozzle 71, it concentrically spreads from the position of the substrate G facing the tip of the nozzle, as indicated by a two dot-and-dash line in FIG. 7, and then flows on the substrate G along the side wall 74 toward the suction-discharge passage 54a. The width of the flow route of the solvent herein corresponds to the length of the width direction of the solvent flow concentrically spread on the substrate G.

Table 2 shows results of an experiment performed to determine optimum values for width L2 of the solvent supply space (suction-evacuation passage) and the supply rate Q of the solvent. Apparent from the results, it was demonstrated that the larger the width L2, the higher the removing performance of the resist coating film 9b, if the solvent supply rate Q is equal. In particular, in the case where the width L2 is 50 mm or more, it was confirmed that the resist coating film 9b is almost completely removed even if the solvent supply rate Q is about 30 cc/minute. As described, when the width L2 is large, the removing performance of the resist coating film 9b increase. This is because if the width of the flow route of the solvent 8 is increased, the discharge region increases, thereby facilitating discharge. According to the visual observation, it was confirmed that the length in the width direction of the flow route of the solvent concentrically spread on the substrate G is 50 mm or more in the case where the width L2 of the suction-discharge passage is 50 mm.

However, when the width L2 of the solvent supply space 8 (suction-exhaust passage) is 50 mm or more, the residual matter was slightly observed on the substrate G. Then, the present inventors presumed that if the suction pressure is increased, the suction exhaust force of the solvent and the dissolved resist may be enhanced. Then, the removal process of the coating film 9b was performed by varying a suction pressure by use of the aforementioned apparatus. The experiment was performed in the same conditions as mentioned above except that the width L2 of the solvent supply space (suction-evacuation passage) was 50 mm and the solvent supply rate Q was 30 cc/min. The evaluation was performed in the same manner as above.

However, even if the pressure of air to be supplied to the vacuum exhaust device 82 was set at 3.5–4 kgf/cm$^2$ and a differential pressure ΔP of the suction-discharge pipe 54 was increased up to −23 to −26 mmHg, a residual matter was left on the substrate G under visual observation. This is because even if only the suction pressure is increased, an exhaust rate is merely changed but the exhaust region is not increased. More specifically, the suction-discharge capacity is large in the proximity with the suction-discharge pipe 54 but small in the region far from the suction-discharge pipe 54. As a result, the solvent and the dissolved resist may be rarely discharged in the region far from the suction-discharge pipe 54.

Then, the present inventors presumed that the exhaust region may be increased if the inner diameter D2 of the suction-discharge pipe 54 is enlarged. Then, the removal process of the coating film 9b employing the aforementioned apparatus was performed by varying the inner diameter of the suction-discharge pipe 54. The processing was performed in the same conditions as mentioned above except that the width L2 was 50 mm, the solvent supply rate Q was 30 cc/minute, and the differential pressure ΔP of the suction-discharge pipe 54 was −35 to −40 mmHg. The evaluation was made in the same manner as mentioned above.

Table 3 shows the results of the coating film removing performance by varying the inner diameter D2 of the suction-discharge pipe 54 while maintaining an orifice inner diameter D1 at a constant value (D1=9 mm). Table 4 shows the results of the coating film removing performance in the case where the orifice inner diameter D1 is changed in various values while maintaining the inner diameter D2 of the suction-discharge pipe 54 at a constant value (D2=12.6 mm). From these results, it was found that the most suitable case is the combination of the inner diameter D1 of 9 mm and the inner diameter D2 of 12.6 mm.

Since the coating film removing performance is influenced by a flow rate of the suction air at the time of exhausting, as described above, it is important to optimize the flow rate of the exhausting air. The suction exhausting passage of the present invention is formed so as to have an orifice and the enlarged portion. By virtue of this structure, the flow rate of suction air at the time of exhausting is increased, thereby improving the coating film removing performance. Furthermore, since the suction-exhausting passage is gradually reduced, the air flow is improved. As a result, the solvent and the dissolved matter are successfully discharged smoothly and swiftly without remaining on the substrate and the passage.

The same removal process of the coating film 9b was performed by varying the differential pressure ΔP of the suction-discharge pipe 54. The removing performance was evaluated in the same manner as above. The obtained results are shown in Table 5. As is apparent from the results, it was confirmed that the solvent and the dissolved resist is rarely discharged if the differential pressure ΔP of the suction-discharge pipe 54 is small even though the inner diameter D2 of the suction-discharge pipe 54 is 12 mm or more.

Another removal experiment of the coating film 9b was performed by varying the amounts of the solvent 8 (cc/minute) to be supplied to the upper surface side and the lower surface side of the substrate in the second coating film removal operation. The coating film removing performance was evaluated in the same manner as above. The results are shown in Table 6. As is apparent from Table 6, the coating film removing performance is improved in the methods of No. 5 and 2. In the method of No. 5, the supply amount of the solvent to the lower surface side of the substrate in the second removal operating is set lower than that of the first removal operating while maintaining the supply amount of the solvent to the upper surface side in the second removal operation at the same level (30 cc/minute) as that of the first removal operation. In the method of No. 2, the experiment is performed in the same manner as the method of No. 5 except that the supply of the solvent to the lower surface side of the substrate is stopped. The experiment of the No. 1 method is performed by setting the second removal operation at the same conditions as in the first removal operation. However, the coating film removing performance of No. 1 is inferior to those of the No. 2 and 5. In the method of No. 3, the supply of the solvent to the upper surface side of the substrate is terminated in the second removal operation and the supply amount of the solvent to the lower surface side in the second removal operation is maintained at the same level (30 cc/minute) as in the first removal operation. In the method of No. 4, only exhausting is performed without supplying the solvent to the upper and lower surfaces in the second removal operation. As a result, the coating film 9b was not removed in the methods of No. 3 and No. 4.

As a result of the trial and error mentioned above, it was confirmed that the resist coating film 9b can be removed almost completely if the discharge rate Q of the solvent is set at 30 cc/minute or more and the width L2 of the solvent flow route on the substrate is set at 50 mm or more, in the case where the an ether-based solvent such as OK thinner is used as the solvent. It was also confirmed that the removing performance of the resist coating film 9b can be further increased if the inner diameter D2 of the suction-discharge pipe 54 is set at 12 mm or more in addition to the aforementioned conditions.

To confirm general adaptability of the apparatus employing the edge removers 51A to 51D, the removal processing of the resist film from the peripheral portion of the substrate G was performed by using an ether-based solvent, PGMEA (propylene glycol monomethyl ether acetate), n-butyl acetate (NBA), methyl-ethyl ketone (MEK), or 2 heptanone, as a solvent. As a result, it was confirmed that the coating film 9b can be removed completely from the peripheral portion of the substrate G by spraying any solvent mentioned above three times, if the supply rate Q of the solvent is set at 30 cc/min or more, and the width L2 of the flow route of the solvent is set at 50 mm or more. It was also confirmed that the removing performance of the resist film can be enhanced if the inner diameter D2 of the suction-discharge pipe 54 is set at 12 mm or more in addition to the aforementioned conditions.

As a result of studies conducted by the present inventors, it was found that the coating film removing performance is improved by either reducing or terminating the solvent supply to the lower surface side of the substrate. This phenomenon results from the fact that if the solvent is supplied excessively to the lower surface side, the dissolved matter remains in the peripheral surface of the substrate, thereby preventing the smooth removal of the coating film.

According to the present invention, the supply amount of the solvent is optimized. It is therefore possible to reduce the amount of consumed solvent as a whole. According to the present invention, the amount of the solvent to be exhausted by the suction-exhausting mechanism is reduced. This means that the amount of air to be sucked is increased by the degree of reduction in the amount of the solvent. As a result, the coating film removing performance is improved. On the other hand, it is desirable that the solvent supply amount to the upper surface of the substrate be maintained constant. This is because if the exhausting is continued while the solvent is not supplied to the upper surface of the substrate, the coating film which has to remain in on the substrate is partially dissolved and spreads into the coating film removing region across a boarder line between the coating film removing region and the coating film maintaining region.

From the foregoing, the unnecessary resist coating film of the peripheral portion of the substrate can be removes even in the case where a safe solvent poor in resist even solubility is used. As a result, the throughput does not virtually decrease.

TABLE 1

| Flow Rate Q (cc/min.) | Removing Performance |
|---|---|
| 50 | ○ |
| 40 | Δ |
| 30 | Δ |
| 20 | Δ |

TABLE 2

| Flow Rate Q | Removing Performance Width L₂ of Solvent Discharge Portion (mm) | | | | |
|---|---|---|---|---|---|
| (cc/min.) | 30 | 40 | 45 | 50 | 60 |
| 50 | ○ | ○ | ○ | ○ | ○ |
| 40 | Δ | Δ | ○ | ○ | ○ |
| 30 | Δ | Δ | Δ | ○ | ○ |
| 20 | Δ | Δ | Δ | Δ | Δ |

TABLE 3

$D_1 = 9$ mm

| $D_2$ (mm) | Removing Performance |
|---|---|
| 12.6 | ◎ |
| 11.0 | ○ |
| 10.0 | Δ |

TABLE 4

$D_2 = 12.6$ mm

| $D_1$ (mm) | Removing Performance |
|---|---|
| 11 | Δ |
| 9 | ◎ |
| 6 | Δ |

TABLE 5

| | Inner Diameter $D_2$ (mm) | | | | | |
|---|---|---|---|---|---|---|
| | 13 | | 12.7 | | 12 | |
| Air Pressure (kgf/cm$^2$) | Differential Pressure ΔP (mmHg) | Removing Performance | Differential Pressure ΔP (mmHg) | Removing Performance | Differential Pressure ΔP (mmHg) | Removing Performance |
| 1.0 | −12 | × | −11 | × | −9 | × |
| 2.0 | −22 | Δ | −21 | Δ | −19 | Δ |
| 3.0 | −30 | ○ | −29 | ○ | −27 | ○ |
| 4.0 | −42 | ◎ | −40 | ◎ | −38 | ◎ |

TABLE 6

| | Flow Rate Q (cc/min.) at 2nd Passing | | Removing |
|---|---|---|---|
| No. | Front Side | Back Side | Performance |
| 1 | 30 | 30 | Δ |
| 2 | 30 | 0 | ◎ |
| 3 | 0 | 30 | × |
| 4 | 0 | 0 | × |
| 5 | 30 | 10 | ◎ |

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of processing a substrate for removing a coating film from the substrate by dissolving the coating film with a solvent, comprising the steps of:

(a) supplying a first-supply solvent independently to each of a first upper surface peripheral portion extending from approximately an outermost substrate perimeter to a predetermined first inner substrate perimeter and a first lower surface peripheral portion extending from approximately the outermost substrate perimeter to a second predetermined inner substrate perimeter, said first-supply solvent dissolving a first amount of coating film from the first upper surface peripheral portion, the first lower surface peripheral portion and a first edge portion extending along an outer substrate edge, and simultaneously suction-discharging an excess of the first-supply solvent and a dissolved matter sideward and outward of the substrate by way of a passage having an orifice portion; and (b) supplying a second-supply solvent to a second upper surface peripheral portion extending from approximately the outermost substrate perimeter to a predetermined third inner substrate perimeter, and simultaneously supplying the second-supply solvent to a second lower surface peripheral portion extending from approximately the outermost substrate perimeter to a fourth predetermined inner substrate perimeter, said second-supply solvent dissolving a second amount of coating film from the second upper surface peripheral portion, the second lower surface peripheral portion and a second edge portion extending along the outer substrate edge, said second supply solvent supplied to the second lower surface peripheral portion in an amount smaller than the first-supply solvent supplied to the first lower surface peripheral portion in the step (a); or smaller than the second-supply solvent supplied to the second upper surface peripheral portion in step (b), and simultaneously suction-discharging an excess of the second-supply solvent and a dissolved matter sideward and outward of the peripheral portion of the substrate through the passage, wherein said first edge portion and said second edge portion are substantially the same.

2. The method according to claim 1, wherein a total amount of the second-supply solvent to be supplied to the second upper surface peripheral portion and the second lower surface peripheral portion of the substrate in the step (b) is smaller than a total amount of the first-supply solvent to be supplied to the first upper surface peripheral portion and the first lower surface peripheral portion of the substrate in step (a).

3. The method according to claim 1, wherein
said substrate is a rectangular substrate, and
in at least one of the steps (a) and (b), a solvent supply position on the substrate is moved along a side of the substrate, and a supply amount of the solvent to be supplied to the peripheral portion of the substrate is increased when the solvent supply position is in the vicinity of the corner portion of the substrate.

4. The method according to claim 1, wherein, in the step (a), the first-supply solvent is supplied to the first upper surface peripheral portion of the substrate at a flow rate of 30 cc/minute or more.

5. The method according to claim 1, wherein an amount of the first-supply solvent to be supplied to the first upper surface peripheral portion of the substrate in the step (a) is substantially the same as an amount of the second-supply solvent supplied to the second upper surface peripheral portion of the substrate in the step (b); and an amount of the second-supply solvent to be supplied to the second lower surface peripheral portion of the substrate in the step (b) is smaller than an amount of the first-supply solvent supplied to the first lower surface peripheral portion of the substrate in the step (a).

6. The method according to claim 1, wherein an amount of the first-supply solvent to be supplied to the first upper surface peripheral portion of the substrate in the step (a) is substantially the same as an amount of the second-supply solvent supplied to the second upper surface peripheral portion the step (b); and no second-supply solvent is supplied to the second lower surface peripheral portion of the substrate in the step (b).

7. An apparatus for processing a substrate for removing a coating film by dissolving the coating film with a solvent, comprising:

a table for adsorbing and holding a substrate with a coating surface upward;

a solvent supply mechanism for supplying a solvent, independently to each of peripheral portions of an upper surface side and a lower surface side of the substrate mounted on the table;

a control mechanism for controlling the solvent supply mechanism to selectively supply the solvent either to both upper surface side and lower surface side or only to the upper surface side;

a passage having a suction port positioned so as to face the peripheral portion of the substrate mounted in the table;

a suction-discharge mechanism communicating to the passage;

an orifice portion formed in the passage, a longitudinal diameter D1 of said orifice portion being narrower than a height of the opening L1; and an enlarged portion arranged downstream of the passage with the orifice portion interposed therebetween and having a larger longitudinal diameter D2 than the orifice portion.

8. The apparatus according to claim 7, wherein the passage is gradually narrowed from the opening to the orifice portion.

9. The apparatus according to claim 7, wherein a width L2 of the suction port is 50 mm or more.

10. The apparatus according to claim 7, wherein the longitudinal diameter D1 of the orifice portion is 9 mm and the longitudinal diameter D2 of the enlarged portion falls within a range of 11.0 to 12.6 mm.

11. A method of processing a substrate for removing a coating film from the substrate by dissolving the coating film with a solvent, comprising the steps of:

(a) supplying a solvent independently to each of peripheral portions of an upper surface side and a lower surface side of the substrate; and (b) supplying the solvent to the peripheral portion of the lower surface side of the substrate in an amount lower than the solvent supplied to the peripheral portion of the lower surface side in the step (a) or lower than that supplied to the peripheral portion of the upper surface side in this step (b); or terminating a supply of the solvent;

wherein in at least one of the steps (a) and (b), a solvent supply position on the substrate is moved along a side of the substrate and a moving speed of the supply position is reduced when the solvent supply position is in the vicinity of a comer portion of the substrate.

* * * * *